United States Patent [19]

Rehm et al.

[11] Patent Number: 4,616,358
[45] Date of Patent: Oct. 7, 1986

[54] SWITCHING MATRIX NETWORK
[75] Inventors: Hans Rehm, Munich; Günter Donig, Ottobrunn, both of Fed. Rep. of Germany
[73] Assignee: Siemens Aktiengesellschaft, Berlin & Munich, Fed. Rep. of Germany
[21] Appl. No.: 815,136
[22] Filed: Jan. 2, 1986

Related U.S. Application Data

[63] Continuation of Ser. No. 459,258, Jan. 19, 1983, abandoned.

[30] Foreign Application Priority Data

Feb. 12, 1982 [DE] Fed. Rep. of Germany ....... 3204900

[51] Int. Cl.$^4$ .............................................. H04Q 3/52
[52] U.S. Cl. ........................................ 370/58; 370/112
[58] Field of Search ................... 370/56, 59, 112, 79
[56] References Cited

U.S. PATENT DOCUMENTS

| Re. 29,215 | 5/1977 | Carney et al. | 370/112 |
| 3,707,604 | 12/1972 | Greefkes et al. | 370/112 |
| 3,794,768 | 2/1974 | Cichetti, Jr. et al. | 370/112 |
| 3,980,831 | 9/1976 | Mertel | 179/2 R |
| 4,271,508 | 6/1981 | Schenk | 370/112 |
| 4,274,112 | 6/1981 | Leysieffer | 358/181 |
| 4,331,950 | 5/1982 | Barabas | 340/825.87 |
| 4,345,273 | 8/1982 | Barabas et al. | 370/58 |
| 4,446,552 | 5/1984 | Tweedy | 370/58 |
| 4,475,187 | 10/1984 | Barabas | 370/58 |

FOREIGN PATENT DOCUMENTS

| 0028415 | 5/1981 | European Pat. Off. . |
| 0054120 | 6/1982 | European Pat. Off. ............ 370/112 |
| 582206 | 8/1933 | Fed. Rep. of Germany . |
| 1115775 | 10/1961 | Fed. Rep. of Germany . |
| 2421002 | 11/1975 | Fed. Rep. of Germany . |
| 2538638 | 3/1977 | Fed. Rep. of Germany . |
| 2719257 | 11/1978 | Fed. Rep. of Germany . |
| 2828662 | 6/1979 | Fed. Rep. of Germany . |
| 2922418 | 12/1980 | Fed. Rep. of Germany . |

OTHER PUBLICATIONS

Braeckelman et al., "A Masterslice LS1 for Subnanosecond Random Logic" IEEE Journal of Solid-State Circuits, vol. SC-14, No. 5, Oct. 1979, pp. 829-832.
"Multiplexeurs Ultra-Rapides pour Traitement de Données", Electronique Industrielle, No. 11, Mar. 1, 1981, p. 37.
Holdsworth et al., "Logic Design-11 'Design with M.S.I.-Multiplexers and Demultiplexers'", Wireless World, Mar. 1979, pp. 47-49.
Saitoh et al., "A Large Size Routing Switcher . . . Broadcasting Stations", N.E.C. Research and Development, No. 60, Jan. 1981, pp. 6-13.
Integrated Circuits, Sh 100 Family, Design Kit, Cell Library, Siemens Handbook, May 20, 1979.
Gate Arrays, Mask-Programmable Logic Circuits, 1981 Ed., Order No. B/2362-101, Siemens AG.

Primary Examiner—Douglas W. Olms
Assistant Examiner—Kenneth I. Rokoff
Attorney, Agent, or Firm—Hill, Van Santen, Steadman & Simpson

[57] ABSTRACT

For switching or, respectively, distributing broadband communication signals in message switching systems, broadband switching matrix networks having crosspoint circuits realized in an ECL technology and which are formed by controllable multiplexers is provided. The controllable multiplexers are mutually interconnected to form multistage crosspoint pyramids respectively exhibiting an outgoing line and a plurality of incoming lines, whereby the controllable multiplexers of a respective plurality of crosspoint pyramids are combined on a chip module. The chip module may be a master slice module. An additional transfer crosspoint in the form of a 2-bit multiplexer can be provided at the tip of the pyramid at each crosspoint pyramid, the additional transfer crosspoint also being connectible to the pyramid chip of a further crosspoint pyramid in order to therefore introduce a corresponding expansion of the switching matrix network. Moreover, when switching or distributing communication signals in the form of frequency-modulated signals and given non-through connection of such a communication signal to the outgoing terminal of the crosspoint pyramid, an unmodulated carrier can be supplied over such an additional transfer crosspoint in order to therefore counter crosstalk interference. The individual crosspoint pyramids can be driven by appertaining drive registers whereby a clock decoder enables the selection of the respective crosspoint pyramid.

10 Claims, 5 Drawing Figures

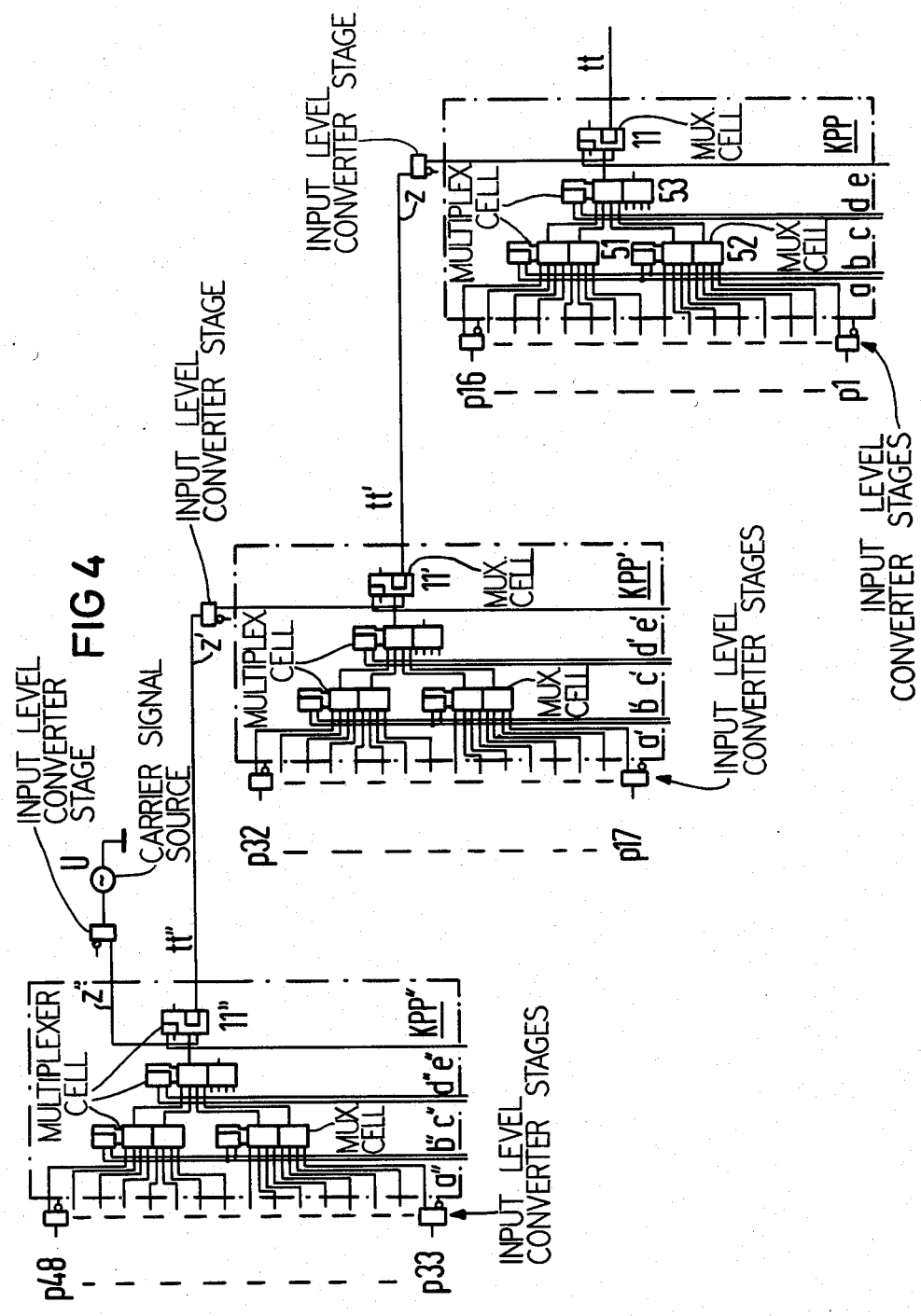

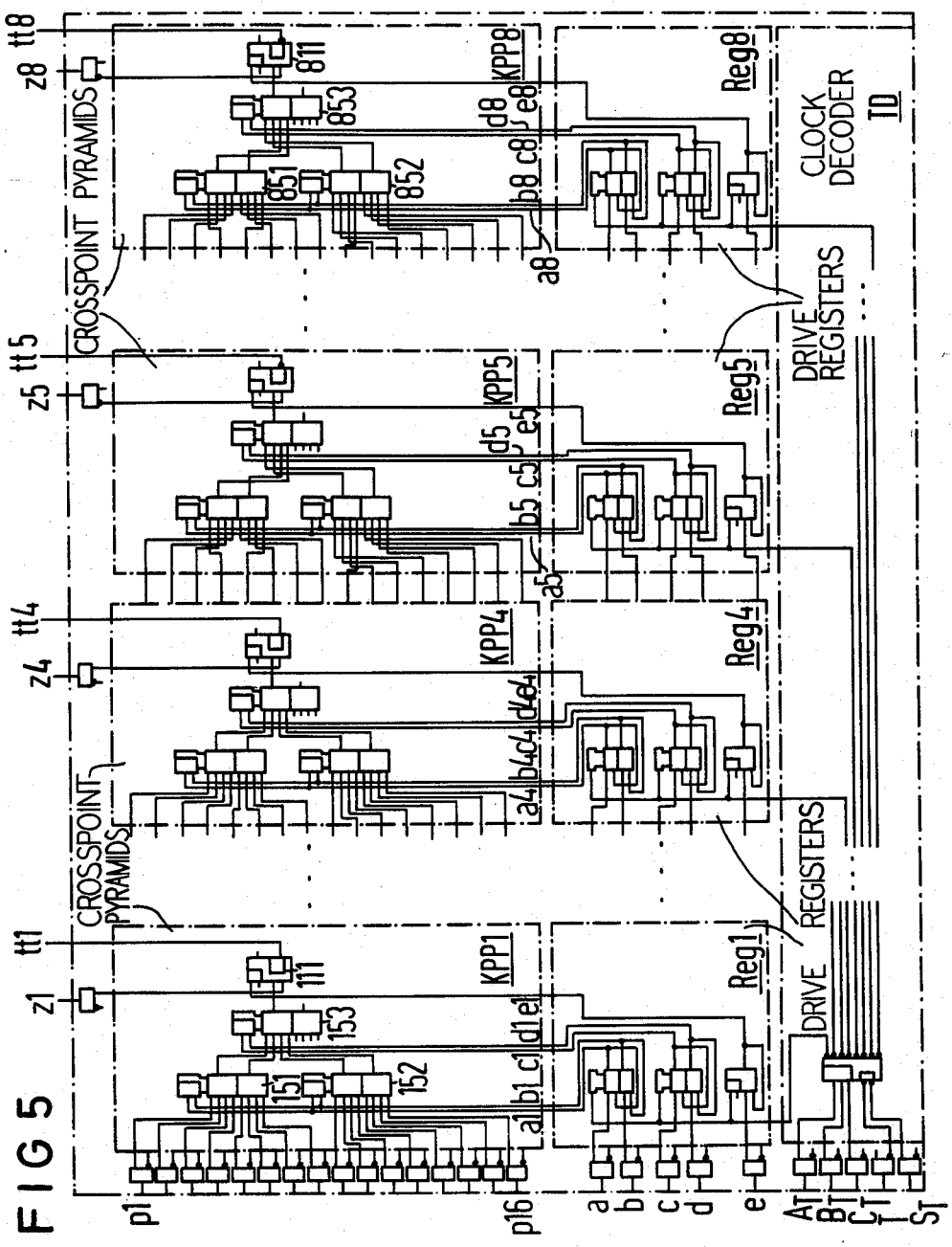

SWITCHING MATRIX NETWORK

This is a continuation of application Ser. No. 459,258, filed Jan. 19, 1983 now abandoned.

BACKGROUND OF THE INVENTION

1. Field of the Invention

The present invention relates to a switching matrix network for switching or, respectively, distributing communication signals in message switching systems.

2. Description of the Prior Art

Recent developments of communication technology have lead to communication switching systems over which, in addition to telephony signals (so to speak, narrow-band signals) and, under certain conditions, data communication signals, television and/or picture telephone signals (broadband in contrast thereto) are also transmitted, to which end it is known, for example, from the German Pat. No. 2,421,002 corresponding to U.S. Pat. No. 3,980,831, German published application No. 25 38 638, German published application No. 29 22 418, all incorporated herein by this reference, to also provide at least one broadband switching matrix array in the switching center in addition to a narrow band switching matrix array, whereby the switching matrix arrays can be controlled with the assistance of a shared control device.

It is desirable in realizing such message switching systems to produce the individual system components, therefore the switching matrix arrays as well, with the least possible expense, this in the meantime encountering difficulties in practice when realizing a broadband switching matrix network, particularly with an increasing degree of broadband, as well as an increasing plurality of incoming lines or, respectively, outgoing lines.

SUMMARY OF THE INVENTION

It is therefore the object of the present invention to provide a switching matrix network for switching or, respectively, distributing broadband communication signals which is realizable with modules available on the market today at economically justifiable expense.

Such a switching matrix network for switching or, respectively, distributing communication signals in communication switching systems is characterized, according to the present invention, by a combination of the following features:

the switching matrix network is a broadband switching matrix network having crosspoint circuits realized in an ECL technology which are formed by controllable multiplexers;

the controllable multiplexers are combined with one another to form multistage crosspoint pyramids exhibiting a respective outgoing line and a plurality incoming lines; and the controllable multiplexers of the respective plurality of crosspoint pyramids are combined on a chip module.

The present invention offers the advantage of being able to have a high degree of recourse in the realization of the switching matrix network to known, so-called LSI master-slice technology, known (for example, from IEEE Journal of Solid-State Circuits, Vol. 14, No. 5, 1979, pp. 829–832, or from "Electronique Industrielle", No. 11/1.3.81, pp. 37–38, fully incorporated herein by this reference), as suitable for rapid telecommunication systems and digital video systems and, therefore, to be able to have recourse to LSI chip modules to be provided with a plurality of multiplexers already existing in the form of so-called LSI master-slice modules having cell wiring according to the techniques of standard cell libraries and, therefore, to arrive without additional expense at a switching matrix network suitable for through-switching broadband signals extending up and into the hundred Mbit/s range, for example 140 Mbit/s or, respectively, 70 MHz signals or even 270 Mbit/s signals. In a further development of the invention, therefore, such a chip module can be advantageously formed by a master slice chip containing a plurality of controllable multiplexers, particularly by a chip of the master slice gate array family known as the Siemens SH100 having 2×4 bit multiplexer cells HMX05. Thereby, when the crosspoint circuits of eight crosspoint pyramids respectively exhibiting an outgoing line and 16 shared incoming lines are united in a further development of the invention on a master slice module, each crosspoint pyramid exhibiting 16 incoming lines and an outgoing line can be formed with two 4-bit multiplexer cells respectively exhibiting two 4-bit multiplexers and a third 4-bit multiplexer cell exhibiting at least one 4-bit multiplexer, this having proven particularly advantageous in view of as low as possible a power and thermal load of a LSI module containing the crosspoint pyramids.

It should be pointed out here that it is known from Wireless World, Vol. 84, No. 1507, March 1978, pp. 47–49, fully incorporated herein by this reference, to interconnect a plurality of multiplexers to form a multiplex pyramid exhibiting an output line and a plurality of input lines, the multiplex pyramid being controlled by a clock counter cyclically sampling the input lines and therefore grouping the input signals in time-division multiplex. However, there are no closer points of contact with the problems underlying the present invention of an economical realization of broadband switching matrix networks for switching or, respectively, distributing communication signals in communication switching systems.

According to another feature of the invention, an additional transfer crosspoint can be additionally provided on the chip module containing the crosspoint pyramids at each crosspoint pyramid, the additional transfer crosspoint being inserted with its one contact break distance into the outgoing line of the crosspoint pyramid. This, on the one hand, opens up the possibility that the outgoing line of a further such crosspoint pyramid is connected to the other incoming terminal of the additional transfer crosspoint, wherewith a corresponding expansion of the switching matrix network is achieved, in particular, both while avoiding an output-side, simple multiple of crosspoint pyramids wherein, given broadband signals extending into the hundred Mbit/s range, the line lengths would no longer be negligibly small in comparison to the wavelength and wherein, therefore, inadmissible reflections and subsequent signal falsifications would occur, as well as also avoiding external logic elements not integrated on the chip module, whereby, a realization of printed circuitboards carrying two or even more such chip modules is at least significantly facilitated. Further, given the switching or, respectively, distribution of communication signals in the form of frequency-modulated signals and given non-through connection of such a communication signal to the outgoing terminal of the crosspoint pyramids, an unmodulated carrier signal can be supplied over the other incoming terminal of the additional transfer crosspoint, whereby, advantageously, a potential crosstalk of other communication signals occurring in the switching matrix network is reliably suppressed at the outgoing terminal.

It should also be pointed out that it is known from the publication N.E.C. Research and Development, No. 60 January 1981, pp. 6–13, also fully incorporated herein by this reference, given a single-stage switching matrix network for distributing video signals constructed with hybrid ICs kept in simple crosspoint technology, to provide an additional, simple, crosspoint at the output side on a crosspoint card carrying a plurality of such crosspoint ICs multiply connected at the output side in order to also be able to multiply switch a plurality of crosspoint cards at the output side. Thereby, there are no closer points of contact with a realization of a broadband switching matrix network via multistage crosspoint pyramids formed with controllable multiplexers.

It should also be pointed out that transfer crosspoint pyramids are known per se (for example, from the German Pat. No. 582,206 and from the German Pat. No. 11 15 775, both fully incorporated herein by this reference) and that switching matrix networks having crosspoint circuits in ECL technology are known per se (for example from the German allowed application No. 28 28 662, corresponding to U.S. Pat. No. 4,274,112, also both fully incorporated herein by this reference); however, there are likewise no closer points of contact with the problems underlying the present invention of realizing broadband switching matrix networks in a particularly economical fashion.

BRIEF DESCRIPTION OF THE DRAWINGS

Other objects, features and advantages of the invention, its organization, construction and operation, will be best understood from the following detailed description taken in conjunction with the accompanying drawings, on which:

FIG. 4 is a schematic representation of an expansion of such a crosspoint pyramid; and FIG. 5 is a schematic representation of a plurality of crosspoint pyramids combined on a chip having appertaining drive circuits.

DESCRIPTION OF THE PREFERRED EMBODIMENTS

Figure 1:
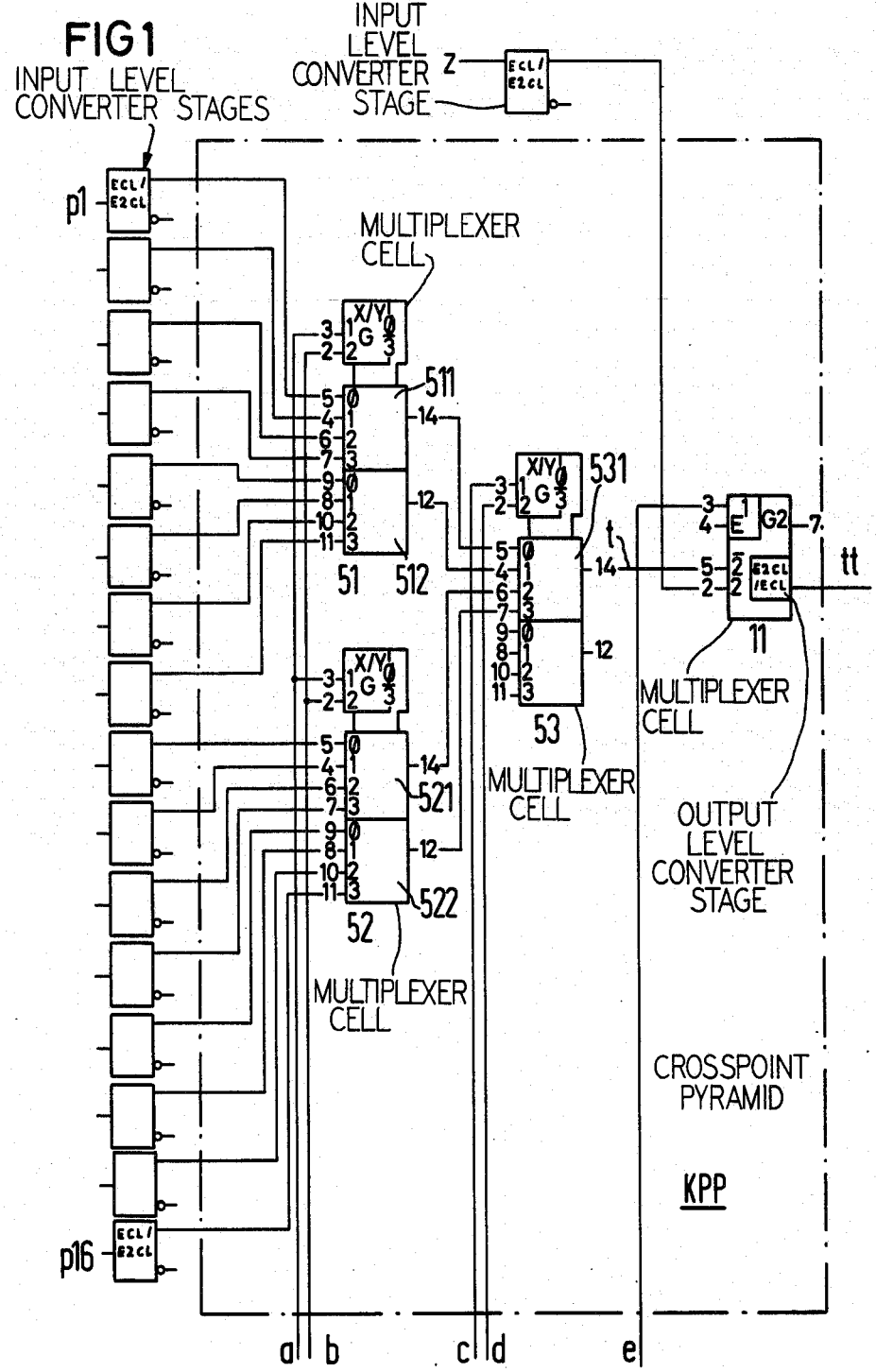
FIG. 1 is a schematic representation of an exemplary embodiment of a crosspoint pyramid constructed in accordance with the present invention.

Schematically illustrated in FIG. 1 of the drawings, and in a scope necessary for an understanding of the invention, is an exemplary embodiment of a crosspoint pyramid KPP which, as shall be explained in greater detail below, is assumed to be combined, according to the present invention, with further such crosspoint pyramids on a master slice chip module to form a broadband switching matrix network. The crosspoint pyramid KPP which, in the illustrated example, comprises 16 incoming lines p1 ... p16 respectively connected via an input level converter stage ECL/E²CL and an outgoing line t–tt conducted over an output level conversion stage E²CL/ECL is formed with two 4-bit multiplexer cells 51, 52 respectively comprising two 4-bit multiplexers 511, 512 and 521, 522 and with a third 4-bit multiplexer cell 53 comprising one 4-bit multiplexer 531. As can be seen from FIG. 1, the third 4-bit multiplexer cell 53 can, exactly like the two other 4-bit multiplexer cells 51 and 52, comprise two respective 4-bit multiplexers of which only one is then exploited. The controllable multiplexer cells 51, 52, 53 can preferably be formed by multiplexer cells known under the designation HMX05 kept in so-called E²CL technology of the E²CL-100 master slice module family SH100 manufactured by Siemens (described, for example, in the Siemens publications "Integrated Circuits-SH100 Family-Design Kit-Cell Library", and "Gate-Arrays-Masken-Programmierbare Logikschaltungen", 1981 Edition Order No. B/2363), whereby, for example, the crosspoint circuits of, for example, eight crosspoint pyramids exhibiting respectively one outgoing line and 16 shared incoming lines can be united on a master slice module. The technical circuit details of such a 4-bit multiplexer cell can be derived from FIG. 2, for example. Both 4-bit multiplexer cells 51 and 52 are driven in common with two control bits over two binary signal lines a, b, so that the 4-bit multiplexers 511, 512, 521, 522 are respectively situated in one specific through connection status of four possible through-connection states. In a corresponding manner, the 4-bit multiplexer cell 53 is driven with two further control bits over two further binary signal lines c, d, so that the 4-bit multiplexer 531 is also respectively situated in one specific through connection state of four possible through connection states.

Figure 2:
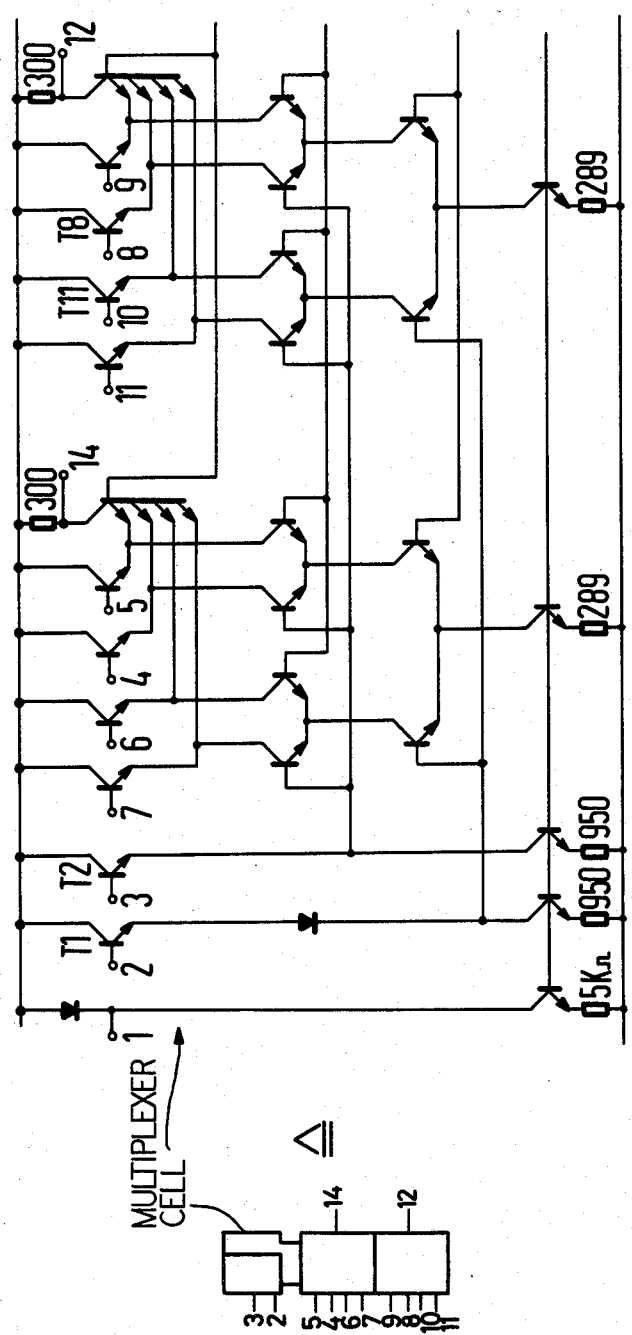
FIGS. 2 and 3 are schematic circuit diagrams of crosspoint circuits provided in the crosspoint pyramids of FIG. 1.
Figure 3:
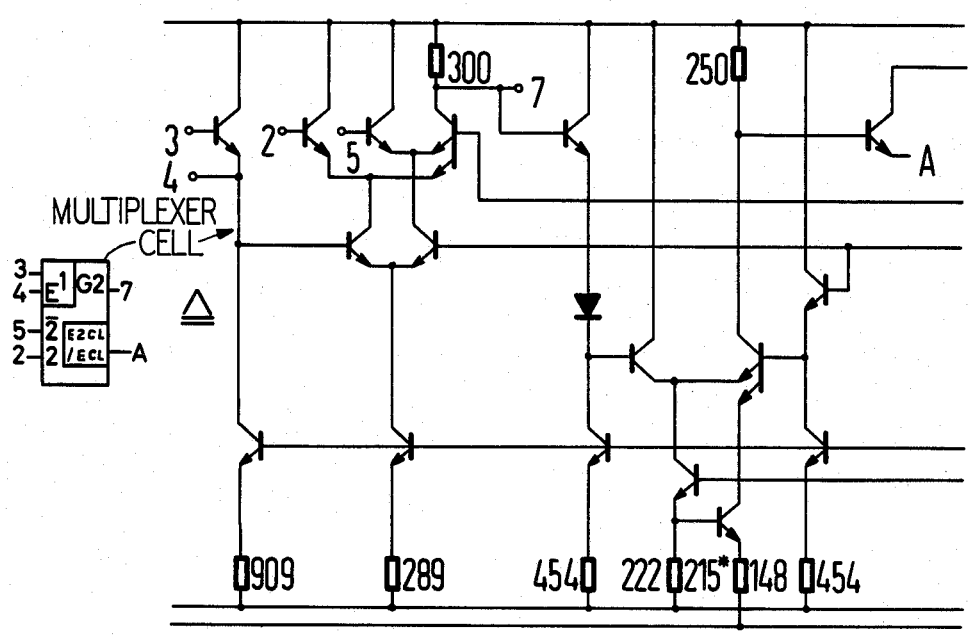

As can be seen from FIG. 1, an additional transfer crosspoint (switch over crosspoint) can also be provided at each crosspoint pyramid KPP, the one contact break distance of the additional transfer crosspoint being inserted into the outgoing line t–tt of the crosspoint pyramid KPP. As also indicated in FIG. 1, the transfer crosspoint can be formed by a 2-bit multiplexer cell 11, for example, by a 2-bit multiplexer cell of the type Siemens SH100-HMXA1 (or, respectively, given inversion of the output signal, of the type SH100-HMXA2); circuit details of such a 2-bit multiplexer cell can be derived, for example, from FIG. 3. This 2-bit multiplexer cell 11 can be driven by an additional control bit over an additional binary signal line e, so that it is respectively situated in its one or in its other through connection state.

As illustrated in detail in FIG. 4, the other incoming terminal of the additional transfer crosspoint 11 can be connected to an outgoing line tt' of a further crosspoint pyramid KPP', which is connected to an additional input z of the crosspoint pyramid KPP, wherewith a corresponding expansion of the switching matrix network is achieved, to, for example, 32 incoming lines p1 ... p32. At such a further crosspoint pyramid KPP', this expansion can be correspondingly expanded to, for example 48 (or, respectively, further multiples of 16) incoming lines p1 ... p48.

When switching or, respectively, distributing communication signals in the form of frequency-modulated signals and given non-through connection of such a communication signal to the outgoing line tt of the crosspoint pyramid KPP, an unmodulated carrier signal can also be supplied over the other incoming terminal of the additional transfer crosspoint 11 in order, therefore, to reliably supress potential crosstalk at the outgoing line tt of other communication signals occurring in the switching matrix network. To this end, a corresponding carrier signal source U can be directly connected to the additional input z of the crosspoint pyramid KPP or, as illustrated in FIG. 4, to a further crosspoint pyramid KPP'' leading to its additional input zz''.

FIG. 4 of the drawings schematically illustrates both previously-discussed alternatives which, thereby, as can also be seen from FIG. 4, can also be applied together.

The combination of the controllable multiplexers of a respective plurality of crosspoint pyramids on a chip module is illustrated in FIG. 5 of the drawings. Illustrated or, respectively, indicated in FIG. 5 are eight crosspoint pyramids KPP1 ... KPP4, KPP5 ... KPP8 respectively comprising an individual outgoing line tt1 ... tt4, tt5 ... tt8 and 16 shared incoming lines p1 ... p16, the crosspoint pyramids, combined on a LSI module, preferably on a gate array of the type Siemens SH100, forming a broadband switching matrix network module 16/8. Thereby, as can also be derived from FIG. 5, the crosspoint pyramids can be divided into two groups in order to reduce the load per incoming level conversion stage (of, for example, the type Siemens SH100-HITE1), whereby the crosspoint pyramids KPP1 ... KPP4 are charged with the non-inverted incoming signals and the crosspoint pyramids KPP5 ... KPP8 are charged with the inverted incoming signals, whereby the inversion is then canceled at the output of the outgoing level comparison stage E2CL/ECL (v. FIG. 1) contained in the 2-bit multiplexer cell ... 811 (the cell 11 in FIG. 1).

In a corresponding manner, as can likewise be derived from FIG. 5, moreover, drive registers Reg1 ... Reg4, Reg5 ... Reg8 belonging to the individual crosspoint pyramids KPP1 ... KPP4, KPP5 ... KPP8 can also be driven, these being illustrated in FIG. 5 below the crosspoint pyramids and from which the drive lines a1, b1, c1, d1, e1; ... ; a4, b4, c4, d4, e4; a5, b5, c5, d5, e5; ... ; a8, b8, c8, d8, e8 (a, b, c, d, e, in FIG. 1) lead to the respectively appertaining crosspoint pyramid. As likewise indicated in FIG. 5, the drive registers Reg can be respectively formed with a 2-bit multiplexer cell (preferably of the type Siemens SH100-HMX01) containing four 2-bit multiplexers respectively driven in pairs and with a 2-bit multiplexer cell (preferably of the type Siemens SH100-HMXA4) containing a 2-bit multiplexer, whereby the individual multiplexers respectively become a flip-flop circuit by means of feedback. Thereby, as can be further seen from FIG. 5, part of the drive registers, such as the registers Reg1 ... Reg4, can be driven with non-inverted signals and part, such as the registers Reg5 ... Reg8, can be driven with inverted signals, whereby the inversion is then taken into consideration by way of a correspondingly-altered assignment of the incoming lines p1 ... p16 to the inputs of the controlled 4-bit multiplexer cells of the crosspoint pyramids KPP5 ... KPP8.

As is likewise further indicated in FIG. 5, the individual drive registers Reg and, therefore, the individual crosspoint pyramids KPP can be designationally driven with the assistance of a clock decoder TD likewise located on the LSI module. The clock decoder TD comprises a demultiplexer of, preferably, the type Siemens SH100-HDM81 which, as can be seen from FIG. 5, is charged with a 3-bit address $A_T$, $B_T$, $C_T$ of the respective register and, therefore, the respective crosspoint pyramid and is also charged with a clock T and, under certain conditions, a chip designation signal $S_T$.

In conclusion, it should also be pointed out that the invention is not restricted to the above-described configuration of multiplexer cells but that, on the contrary, other multiplexer structures can also be employed. Instead of the 4-bit multiplexer cell 53 of the type SH100-HMX05 containing two 4-bit multiplexers and illustrated in FIG. 1, therefore, a 2-bit multiplexer cell of the type SH100-HMX06 containing a four 2-bit multiplexer can, for example, be employed wherein two 2-bit multiplexers driven in common with a control bit, whose total of four demultiplexer terminals are connected to the total of four multiplexer terminals of the adjacent 4-bit multiplexer cells (51, 52 in FIG. 1), lead with their total of two multiplexer terminals to the two demultiplexer terminals of the third 2-bit multiplexer lying at the point of the pyramid with its multiplexer terminal and driven with a further drive bit, whereas the fourth 2-bit multiplexer remains unutilized. This, however, is not illustrated in the drawings since it is not required for an understanding of the invention.

Although we have described our invention by reference to particular illustrative embodiments thereof, many other changes and modifications of the invention may become apparent to those skilled in the art without departing from the spirit and scope of the invention. We therefore intend to include within the patent warranted hereon, all such changes and modifications as may reasonably and properly be included within the scope of our contribution to the art.

We claim:

1. A broadband switching matrix network for switching or distributing communication signals in communication switching systems, comprising:

a plurality of crosspoint circuits each comprising an uncyclically controllable multiplexer including emitter-coupled logic circuits and control inputs for receiving selection signals to establish a variable sequence of respective specific switch-through states of said multiplexer;

said controllable multiplexers each including a plurality of incoming lines and an outgoing line which form the respective receiving and transmitting terminals of the broadband switching matrix, and said multiplexers interconnected to define switching circuit pyramids; and said multiplexers of a respective plurality of switching circuit pyramids combined on an integrated circuit chip module.

2. The switching matrix of claim 1, wherein:

each of said chip module is a master slice chip module comprising a plurality of said controllable multiplexers.

3. The switching matrix of claim 2, wherein:

each of said master slice chip modules comprises eight crosspoint pyramids each including sixteen shared incoming lines and a respective outgoing line.

4. The switching matrix of claim 3, wherein:

each of said crosspoint pyramids comprises two 4-bit multiplexer cells each including two 4-bit multiplexers, and a third 4-bit multiplexer cell comprising at least one 4-bit multiplexer.

5. The switching matrix of claim 3, wherein:

each of said crosspoint pyramids comprises two 4-bit multiplexer cells each including two 4-bit multiplexers, and a 2-bit multiplexer cell comprising at least three 2-bit multiplexers.

6. The switching matrix of claim 1, wherein:

each of said crosspoint pyramids comprises an additional multiplexer interposed in the outgoing line of the respective crosspoint pyramid.

7. The switching matrix of claim 6, wherein:
said additional multiplexer comprises an input connected to an outgoing line of another switching circuit pyramid.

8. The switching matrix of claim 7, and further comprising:
a source of unmodulated carrier, and wherein
a switching circuit pyramid, which is provided with frequency-modulated signals and when such signals are not through-connected, said additional multiplexer including an input and an output, connected to said source of unmodulated carrier which is switched through to said output to prevent crosstalk.

9. The switching matrix of claim 6, wherein:
said additional multiplexer comprises a 2-bit multiplexer cell.

10. The switching matrix of claim 1, wherein:
said switching circuit pyramids are divided into two groups for respectively receiving on their incoming lines non-inverted input signals and inverted input signals.

* * * * *